US009385116B2

(12) United States Patent
Abessolo Bidzo et al.

(10) Patent No.: US 9,385,116 B2
(45) Date of Patent: Jul. 5, 2016

(54) SEMICONDUCTOR ESD DEVICE

(71) Applicant: NXP B.V., Eindhoven (NL)

(72) Inventors: Dolphin Abessolo Bidzo, Gertsweg (NL); Bart van Velzen, Arnhem (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/692,988

(22) Filed: Apr. 22, 2015

(65) Prior Publication Data

US 2015/0311194 A1    Oct. 29, 2015

(30) Foreign Application Priority Data

Apr. 24, 2014    (EP) ..................................... 14165780

(51) Int. Cl.

| | | |
|---|---|---|
| H01L 29/00 | (2006.01) | |
| H01L 27/02 | (2006.01) | |
| H01L 29/417 | (2006.01) | |
| H01L 21/027 | (2006.01) | |
| H01L 21/285 | (2006.01) | |
| H01L 29/45 | (2006.01) | |
| H01L 29/66 | (2006.01) | |
| H01L 29/78 | (2006.01) | |

(52) U.S. Cl.
CPC .......... *H01L 27/0266* (2013.01); *H01L 21/027* (2013.01); *H01L 21/28518* (2013.01); *H01L 27/0248* (2013.01); *H01L 27/0259* (2013.01); *H01L 29/41725* (2013.01); *H01L 29/45* (2013.01); *H01L 29/665* (2013.01); *H01L 29/78* (2013.01)

(58) Field of Classification Search
CPC ............ H01L 27/0266; H01L 27/0259; H01L 29/665; H01L 27/0248
See application file for complete search history.

(56) References Cited

U.S. PATENT DOCUMENTS

2003/0213995 A1*  11/2003  Duvvury ............. H01L 27/0277
                                                          257/355
2004/0004268 A1*   1/2004  Brown ................ H01L 23/5252
                                                          257/529

(Continued)

FOREIGN PATENT DOCUMENTS

| JP | 2004 221441 A | 8/2004 |
|---|---|---|
| WO | 03/094241 A1 | 11/2003 |
| WO | 03/094242 A1 | 11/2003 |

OTHER PUBLICATIONS

Amerasekera, A. et al; "ESD in Silicon Integrated Circuits, $2^{nd}$ edition"; John Wiley; pp. 150-155 (2002).

Xie, Haolu et al; "3D Electro-Thermal Modeling of GGNMOS ESD Protection Structure"; 2004 IEEE Asia-Pacific Conference on Circuits and Systems; 4 pages. (Dec. 2004).

(Continued)

*Primary Examiner* — Ngan Ngo

(57) ABSTRACT

An electrostatic discharge (ESD) protection device on a semiconductor substrate and a method for making the same. The device has an active region. The active region includes a gate. The active region also includes a source including a silicide portion having a source contact. The active region further includes a drain including a silicide portion having a drain contact. The source and drain each extend away from the gate along a device axis. The drain contact is laterally offset with respect to the source contact along a direction orthogonal to the device axis whereby current flow between the source contact and the drain contact has a lateral component. The device further comprises a non-silicide region located laterally between the drain contact and the source contact.

18 Claims, 5 Drawing Sheets

(56) References Cited

U.S. PATENT DOCUMENTS

| | | |
|---|---|---|
| 2005/0167739 A1 | 8/2005 | Kogami et al. |
| 2009/0250765 A1* | 10/2009 | Leibiger ............ H01L 29/0692 257/384 |
| 2012/0248512 A1* | 10/2012 | Herberholz ......... H01L 23/4824 257/288 |
| 2012/0307410 A1* | 12/2012 | Yamazaki ....... H01L 21/823842 361/88 |
| 2014/0167099 A1* | 6/2014 | Mergens ................ H01L 29/87 257/109 |

OTHER PUBLICATIONS

Mack, William D. et al; "New ESD Protection Schemes for BiCMOS Processes with Application to Cellular Radio Designs"; ISCAS; pp. 2699-2702 (1992).

NXP, UM10204—I2C-bus specification and user manual, Rev 03 (Jun. 19, 2007).

Extended European Search Report for Application 14165780.9 (Dec. 8, 2014).

* cited by examiner

SEMICONDUCTOR ESD DEVICE

CROSS-REFERENCE TO RELATED APPLICATIONS

This application claims the priority under 35 U.S.C. §119 European patent application no. 14165780.9, filed on Apr. 24, 2014, the contents of which are incorporated by reference herein.

FIELD OF THE INVENTION

This invention relates to an electrostatic discharge (ESD) protection device on a semiconductor substrate. This invention also relates to making an ESD protection device.

BACKGROUND OF THE INVENTION

Electrostatic discharge (ESD) projection circuits may provide ESD protection in a number of applications. A variety of different ESD devices are available for use in circuits of this kind. One example of such a device is the grounded gate NMOS (ggNMOS) transistor. An example of a ggNMOS device is schematically illustrated in FIG. 1.

The device includes a source 4, a gate 8 and a drain 6 in a semiconductor substrate. In particular, the source 4 and drain 6 may be provided in a p-well 14 in the substrate. As the device is an NMOS device, the source 4 and drain 6 are themselves n-doped (N+). A p-doped (P+) contact region 2 may also be provided to allow electrical connection to the body of the substrate. The p-doped contact region 2, the source 4 and the gate 8 may be electrically connected together to a common reference potential via a common bond pad 12, which forms a cathode of the device. The common reference potential is typically ground. The drain 6 is connected to a contact pad 16 which forms an anode of the device.

The ggNMOS transistor shown in FIG. 1 operates as a parasitic npn bipolar transistor in use. In particular, the drain 6 of the ggNMOS transistor acts as the collector, the body of the substrate in the p-well 14 acts as the base, and the source of the ggNMOS transistor acts as the emitter. The bipolar transistor is schematically illustrated using the reference sign 10 in FIG. 1. During an ESD event, the collector-base junction (the junction between the drain 6 and the body region of the ggNMOS transistor in the p-well 14) becomes reverse biased and avalanche breakdown at that junction occurs. The breakdown current flows to ground, which forms a potential across the resistor 18 (which is schematically representative of the base resistance of the parasitic npn). This causes a positive voltage to form across the base-emitter junction (forward bias) triggers the parasitic npn transistor.

FIGS. 2 and 3 illustrate the layouts of two ggNMOS transistors that are known in the art, and which may be used in a device of the kind explained above in relation to FIG. 1.

The device in FIG. 2 includes an active region 25 having a source 20, a gate 22 and a drain 30. The device in FIG. 2 is a fully silicided device. Accordingly, the source 20, drain 30 and also an upper portion of the gate poly of the gate 22 all comprise silicide. Silicide is itself a commonly used material in the field of semiconductor device manufacture, and various silicidation processes are also well known in the art. A plurality of source contacts 12 are provided on the source 20 and a plurality of drain contacts 16 are provided on the drain 30.

A fully silicided device of the kind shown in FIG. 2 can suffer from device failure due to a phenomenon known as hot spotting. This is a well-known phenomenon in which current flowing from the source to the drain naturally finds the path of lowest resistance within the device and concentrates there. The high current density in this region eventually causes the device to fail.

The example device shown in FIG. 3 also includes an active region 25 having a source 20, a drain 30 and a gate 22. Again, the device has a plurality of source contacts 12 and a plurality of drain contacts 16. In the example of FIG. 3, the device includes a non-silicide region 35. The non-silicide region 35 may be formed using a protection mask during manufacture to prevent an area of the active region 25 of the device from being silicided during the silicidation process. The non-silicide region 35 in FIG. 3 is represented by the cross-hatched area. The area of the active region 25 outside the non-silicide region 35 (which is not cross-hatched in FIG. 3) is silicided.

In this example, the sheet resistance of the non-silicided region 35 of the device provides a ballast resistance which can inhibit an overly large current from flowing within the device, thereby helping to prevent the hot spotting phenomenon noted above in respect of the fully silicided device of FIG. 1. However, a consequence of the addition of the non-silicide region 35 is that the size of the active region 25 of the device increases (this is represented by the arrow labelled L in FIG. 3). The increase in size is typically 2 L, which includes the length of the non-silicide region 35 on either side of the gate 22. It will be appreciated that a substantial increase in the size of the device is generally not a desirable consequence in a number of applications in which space is at a premium.

WO2003/094242 describes a field effect transistor (FET) which has an active area in a semiconductor body, a channel formed in the active area, a source diffusion zone and a drain diffusion zone alternating with each other in the active area, a source diffusion zone being separated from a drain diffusion zone by the channel. Each source diffusion zone has a source contact and each drain diffusion zone has a drain contact.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to a first aspect of the invention, there can be provided an electrostatic discharge (ESD) protection device on a semiconductor substrate. The device has an active region. The active region includes a gate. The active region also includes a source including a silicide portion having a source contact. The active region further includes a drain including a silicide portion having a drain contact. The source and drain each extend away from the gate along a device axis. The drain contact is laterally offset with respect to the source contact along a direction orthogonal to the device axis whereby current flow between the source contact and the drain contact has a lateral component. The device further comprises a non-silicide region located laterally between the drain contact and the source contact.

The non-silicide region can provide ballast series resistance for the device, thereby reducing the tendency for device failure due to the development of hotspots, which is an issue in fully silicided devices. This is implemented in a manner that need not lead to an increase in the size of the device because the non-silicide region is located laterally between the drain contact and the source contact, so that current flowing laterally between the source contact and the drain contact passes through the non-silicide region.

The device may include a plurality of drain contacts and a plurality of source contacts, In some embodiments, each drain contact may be laterally offset with respect to its neighbouring source contact(s). The non-silicide region may comprise a plurality of non-silicide sections each located laterally between a respective pair of drain and source contacts. These sections may be provided in the form of stripes passing across the device from the drain side to the source side. Accordingly, the device is scalable for a range of different applications.

A lateral dimension $W_1$ of the non-silicide sections may be at least 0.2 µm and at most equal to a full width of the device minus the lateral widths of source contact(s) and drain contact(s). For best performance, it has been found that the lateral dimension $W_1$ of the non-silicide sections may be in the range $0.2 \ \mu m \leq W_1 \leq 8 \ \mu m$. In some examples, the lateral dimension $W_1$ may be the same for each non-silicide section, creating a sectioned device in which the current passing through each section is approximately the same. This can in turn prevent hot spotting.

In some embodiments, at least some of the plurality of non-silicide sections of the non-silicide region may be linked together by further non-silicide sections. In general, the purpose of these further non-silicide sections can be to further reduce the silicided area of the device. The further non-silicide sections may extend laterally across the drain or the source for linking the non-silicide sections together. At least some of the further non-silicide sections may occupy substantially all of the drain or source on an opposite side of the gate from a respective source contact or drain contact. Again, this can aid in maximising the non-silicide area of the device. At least some of the further non-silicide sections may have an edge coinciding with the gate. Alignment of the edge with the gate may be challenging however, once again, it can further increase the non-silicide area of the device.

A lateral dimension $W_2$ of the further non-silicide sections may be in the range $0.5 \ \mu m \leq W_2 \leq 2 \ \mu m$. In general, smaller values of $W_2$ may increase ESD robustness. In some examples, $W_2$ may correspond to a lateral width of a respective silicide portion of the source or drain. In some examples, to optimise the performance of the device, the value of $W_2$ may be substantially equal to the minimum design rule of the technology used to manufacture the device.

In some embodiments the non-silicide region may extend over a full length of the active region along the device axis. In this way, short circuiting of the non-silicide region via silicided parts of the device can be avoided.

The gate, the source and a body region of the substrate may be electrically connected together for application of a common reference potential. The common reference potential may be a ground potential. In this way, a device according to an embodiment of this invention may be configured as a ggNMOS device and may be operated as a parasitic NPN bipolar transistor in an ESD protection circuit.

According to another aspect of the invention, there is provided an ESD protection circuit comprising a device of the kind described above.

According to another aspect of the invention, there is provided a method of making an electrostatic discharge (ESD) protection device. The method includes providing a semiconductor substrate. The method also includes forming an active region of the device on the substrate by: forming a gate, a source and a drain, wherein the source and drain each extend away from the gate along a device axis; performing silicidation to form a silicide portion in the drain and the source; and providing a drain contact on the silicide portion of the drain and source contact on the silicide portion of the source, wherein the drain contact is laterally offset with respect to the source contact along a direction orthogonal to the device axis. The silicidation is performed using a mask to retain a non-silicide region extending along the device axis over a full length of the active region in a region located laterally between the drain contact and the source contact.

The mask may comprise a protection layer that may be used for preventing silicidation of the non-silicide region during manufacture. The protection layer may correspond in shape to the desired layout of the non-silicide region of the device. In some embodiments the protection layer is retained in the final device. However, in other embodiments the protection layer may be removed after the silicidation is performed.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Figure 4:
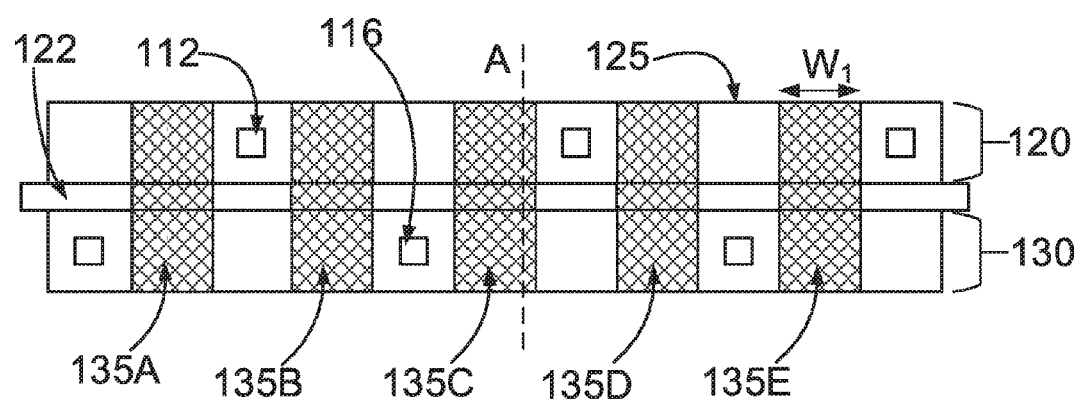
FIGS. 4-6 each show the layout of a semiconductor device for providing protection against ESD in accordance with an embodiment of the invention.

FIG. 4 illustrates an electrostatic discharge (ESD) protection device in accordance with an embodiment of this invention. The device is provided on a semiconductor substrate. The substrate may, for example, comprise silicon. The substrate may have a body region in or on which various parts of the device may be located.

The device has an active region 125. The active region includes a gate 122, a source 120 and a drain 130. The gate 122, source 120 and drain 130 may be provided at a major surface of the substrate. In this example, the gate 122, source 120 and drain 130 are each elongate and have a long dimension orthogonal to a device axis labelled in FIG. 4 by the dashed line labelled A. The device axis is the axis along which the source 120 and drain 130 each extend away from the gate 122. In particular, the source 120 may extend away from the gate 122 along the device axis in a first direction and the drain 130 may extend away from the gate 122 in a second direction along the device axis, where the first direction is generally opposite the second direction. The device axis is similarly labelled in the examples described below in relation to FIGS. 5 and 6.

The active region 125 includes regions that comprise silicide and regions that are non-silicide regions. The non-silicide region 135 in FIG. 4 is indicated with cross-hatching. Outside the cross-hatched area, the device comprises silicide. The source 120 and the drain 130 thus each comprise silicide portions. The silicide region in this embodiment and in the further embodiments described below comprises Cobalt-Silicide. However, it will be appreciated that other types of silicide may be used.

The device also includes one or more source contacts 112 and one or more drain contacts 116. As shown in FIG. 4, the source contacts 112 and drain contacts 116 of the device are provided in the silicide portions of the source 120 and drain 130.

A device according to an embodiment of the invention may have a single source contact 112 and a single drain contact 116. In practice however, it is envisaged that a device according to an embodiment of the invention is likely to have a plurality of such contacts in order to increase the amount of current that can pass through the device.

As can be seen in FIG. 4, each drain contact 116 is laterally offset with respect to its neighbouring source contacts 112. For instance, the drain contact 116 in the bottom left-hand side of the device shown in FIG. 4 is offset with respect to the far left source contact 112. Accordingly, it is envisaged that at least in some embodiments, the area of the source directly opposite an area of the drain 130 in which a drain contact 116 is provided would not be provided with a source contact 112. Similarly, the area of the drain 130 directly opposite the area of the source 120 including a source contact 112 would not be provided with a drain contact. This lateral offsetting of the drain contacts 116 with respect to the source contacts 112 is along a direction generally orthogonal to the device axis.

Figure 1:
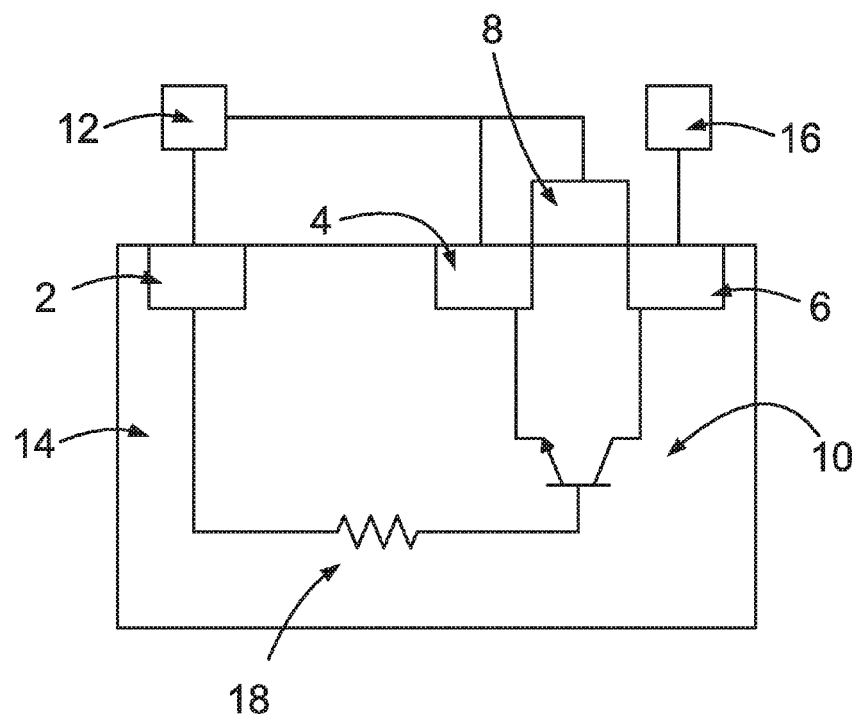
FIG. 1 schematically illustrates an ESD protection device including a ggNMOS device operating as a parasitic npn bipolar transistor.
Figure 2:
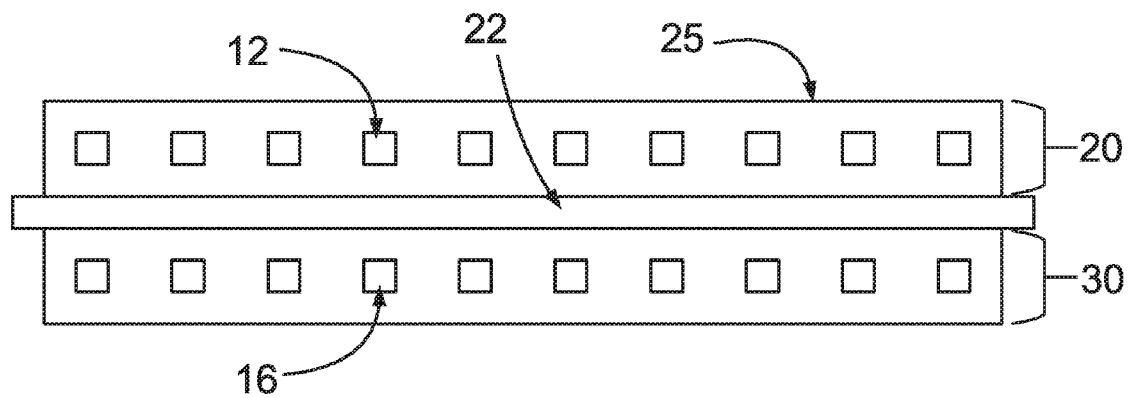
FIG. 2 shows the layout of a fully silicided semiconductor device for providing protection against ESD.
Figure 3:
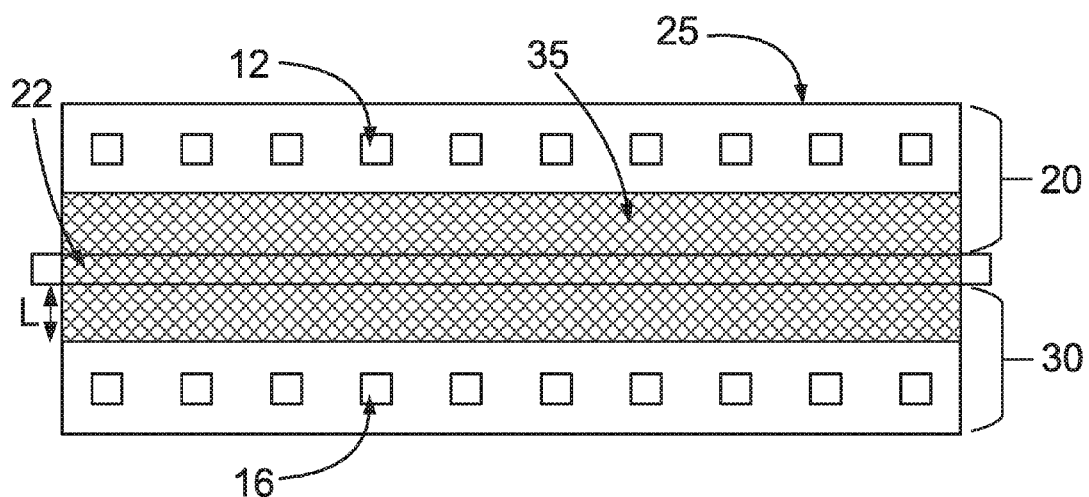
FIG. 3 shows the layout of an unsilicided semiconductor device for providing protection against ESD.

The lateral offsetting of the drain contact 116 with respect to the source contacts 112 means that current flowing between the drain 130 and the source 120 via the respective drain contacts 116 and source contacts 112 has a lateral component. Current flowing through the device is forced to flow at least to some degree laterally and not directly across the gate to the opposite side of the device. In this way, it can be ensured that the full width of the device is used for current flow, which is not necessarily the case in devices of the kind described above in relation to FIGS. 1 and 2.

As shown in FIG. 4, the device according to this embodiment includes a non-silicide region 135, which is represented by the cross hatched region. This non-silicide region 135 may be formed during manufacture using an appropriately patterned mask comprising a protection layer of the kind described above. The devices described below in relation to FIGS. 5 and 6 may also be manufactured using this method.

The non-silicide region 135 is located laterally between the drain contacts 116 and source contacts 112 of the device. Because of this, current flowing laterally within the device as noted above must pass through the non-silicide region 135. In this way, the increased sheet resistance of the non-silicide region (which may, for example, comprise doped silicon or any other suitable material) as compared to, for example, silicide, can provide ballast resistance for the device. This improves the ESD robustness of the device.

In contrast with the example described above in relation to FIG. 2, because the non-silicide region 135 is located laterally between the source contacts 112 and the drain contacts 116, the length of the device along the device axis does not need to be increased to accommodate the non-silicide region. Moreover, the lateral extent of the device need not be increased to accommodate the non-silicide region 135. This is, for example, the case where the number of contacts in the device is not critical to the ESD robustness so that the number of contacts can be reduced to make way for the non-silicide region. Examples of devices in which the number of contacts is non-critical are secondary ESD and local CDM clamps (examples of these are noted below in relation to FIG. 10—see reference signs 62 and 68, respectively. Accordingly, ballast resistance can be provided for increasing the ESD robustness of the device in a manner that does not substantially increase the size of the device.

Figure 5:
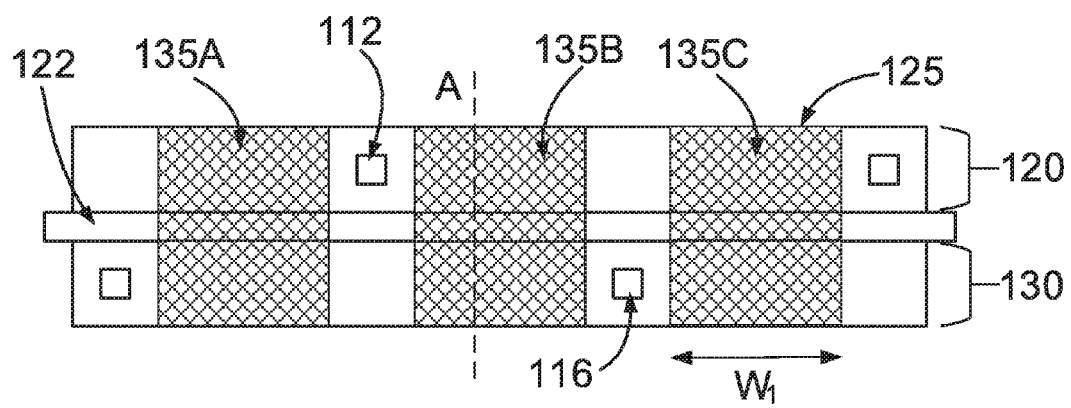

In the example of FIG. 4, the non-silicide region 135 is provided as a plurality of separate sections 135A, 135B, 135C, 135D and 135E. Each section is located laterally between a respective pair of source and drain contacts. The lateral extent $W_1$ of the sections of the non-silicide region 135 may be chosen in accordance with the desired ballast resistance to be achieved. This is illustrated in FIG. 5, in which a device having non-silicide sections 135A, 135B and 135C that are larger along the lateral direction than those of the device of FIG. 4 is shown, The lateral dimension $W_1$ of the non-silicide sections may be at least 0.2 µm and at most equal to a full width of the device minus the lateral widths of source contact(s) and drain contact(s) (although the device may typically include a plurality of source and drain contacts, it is envisaged that a device including a single source contact and a single drain contact may have a non-silicide section having a lateral dimension $W_1$ equal to the full width of the device less the width of the source contact and the drain contact). To achieve the best performance a range of $0.6 \text{ µm} \leq W_1 \leq 8 \text{ µm}$ may be chosen. Typically the dimension $W_1$ may be limited at the lower end by the minimum design rule of the technology used to manufacture the device. In some examples (such as that shown in FIG. 5), the number of contacts can be reduced to make way for wider non-silicide sections. In this way, wider non-silicide sections may be accommodated without a substantial increase in the size of the active region.

In the examples described here in relation to FIGS. 4 and 5 (and also in FIG. 6), the device includes a plurality of drain contacts 116 and a plurality of source contacts 112. However, it is envisaged that a device according to an embodiment of the invention may include a single source contact 112 and a single drain contact 116. In this device, the non-silicide region 135 could include a single section, for example a section such as section 135A shown in FIG. 4 or 5 located laterally between a drain contact 116 and a source contact 112.

Figure 6:
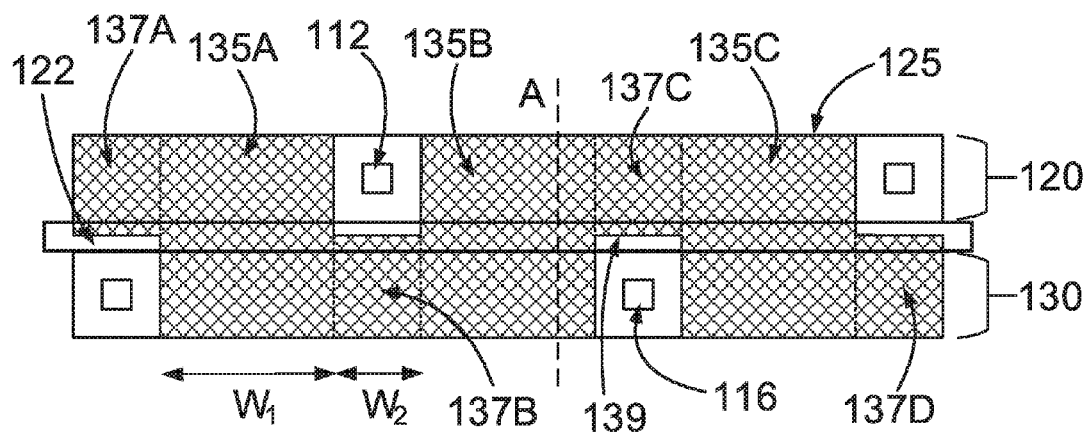

FIG. 6 illustrates another example of the invention. In this example, the non-silicide region 135 includes further sections 137A, 137B, 137C and 137D. These further sections 137A, 137B, 137C and 137D link together the sections 135A, 135B and 135C. The further sections 137A, 137B, 137C and 137D in general have the purpose of maximising the non-silicided area of the active region 125.

Although the ESD robustness of the kind shown in FIG. 6 is theoretically better than the ESD robustness of a device of the kind shown in FIGS. 4 and 5, owing to the increased area of the non-silicide region providing additional ballast resistance, a device of the kind shown in FIG. 6 may be more difficult to manufacture. This is because the further sections need to be aligned with the gate 122. In particular, an edge 139 of each further section 137 would need to be aligned in this way.

In one embodiment, the further sections 137A, 137B, 137C and 137D may occupy substantially all of the drain 120 or source 130 on an opposite side of the gate from a respective source contact 112 or drain contact 116. The lateral extent of each further section 137A, 137B, 137C and 137D (denoted as $W_2$ in FIG. 6) can be chosen to tailor the sheet resistance of the device, In one embodiment, the lateral dimension $W_2$ of the further non-silicide sections is in the range $0.5\ \mu m \leq W_2 \leq 2\ \mu m$. In general, smaller values of $W_2$ may increase ESD robustness. The lateral extent $W_2$ of the further sections 137 may be chosen to correspond to the lateral extent of the silicide portions of the source 120 and drain 130 as can be seen from the dotted lines shown in FIG. 6. In one embodiment, the value of $W_2$ may be chosen to be approximately equal to the minimum design rule of the technology used to manufacture the device, for optimising the ESD robustness of the device.

It is envisaged that the non-silicide region may extend over a full length of the active region 125 of the device along the device axis. In this way, short-circuiting of the current flowing within the device through regions of the active region 125 that comprise silicide can be prevented. By providing non-silicide sections which extend over the full length of the active region along the device axis, it can be ensured that current flowing laterally within the device must pass through the non-silicide region 135 and/or the respective sections thereof, which have a relatively high sheet resistance as compared to silicide.

In order to use the device as a ggNMOS device, in one embodiment, the body region of the substrate incorporating the device, the gate and the source may be electrically connected together for application of a common reference potential. Typically, the common reference potential may be a ground potential.

A device according to an embodiment of this invention may be manufactured using a number of process steps. Firstly, a semiconductor substrate may be provided. The substrate may typically comprise silicon, In a next step, an active region is formed on the substrate. This includes forming a gate, a source and a drain on the substrate. The source and drain each are formed so that they extend away from the gate along a device axis having a configuration of the kind described above in relation to FIGS. 4-6.

In a next step, silicidation in performed to form silicide portion(s) in the drain and the source. This silicidation process is performed using a mask to retain a non-silicide region located laterally between the drain contact(s) and the source contact(s). The drain contact(s) and the source contact(s) themselves may be provided on the device following the silicidation step. As noted above, the drain contact(s) and the source contact(s) may be laterally offset with respect to each other along a direction orthogonal to the device axis, whereby current with a lateral component may flow between the source contact(s) and the drain contact(s). The mask used in the silicidation process may be removed after silicidation has been completed.

As described herein, embodiments of this invention may provide an ESD device having increased ESD robustness. Data demonstrating this improvement in ESD robustness are presented in FIGS. 7-9. The data also demonstrate that the inclusion of features such as the offset source and drain contacts and the laterally located non-silicide regions do not adversely affect key device parameters compared to, for example, fully silicided devices of the kind described above in relation to FIG. 2.

Figure 7:
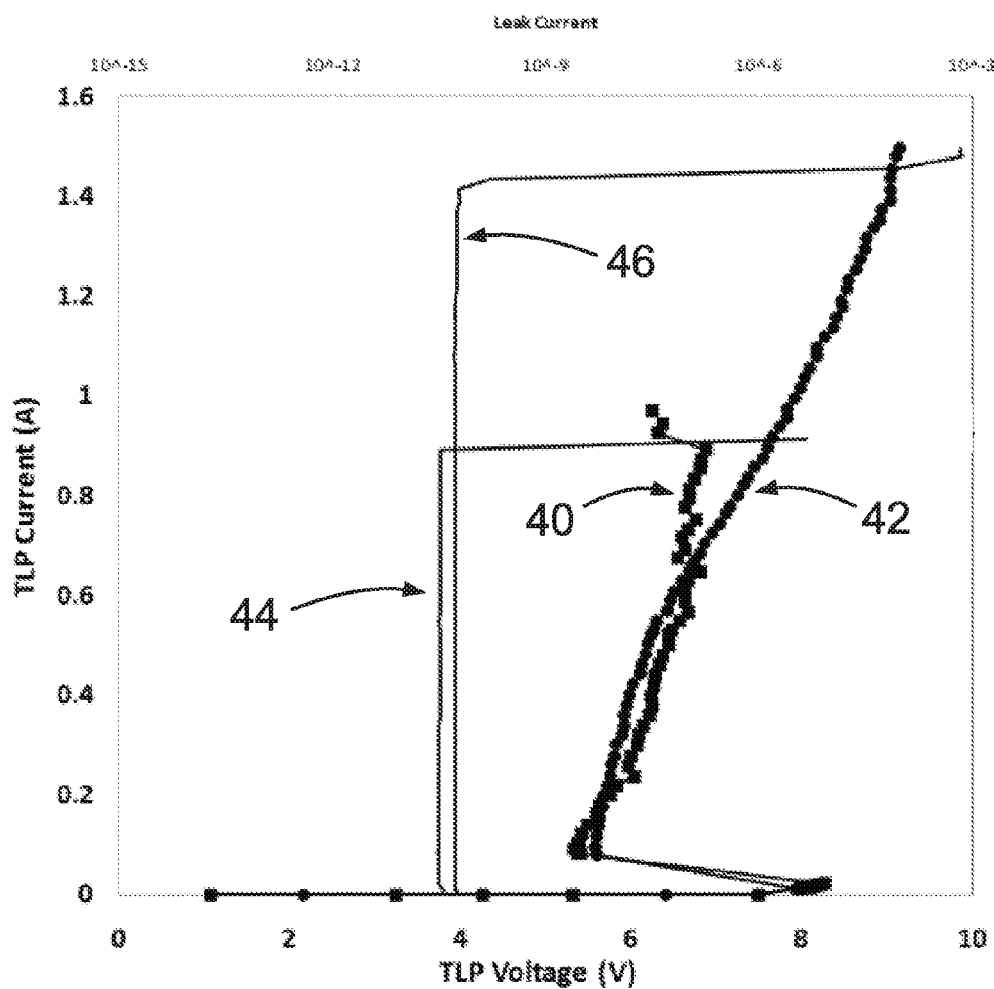
FIG. 7 shows a transmission line plot (TLP) for a semiconductor device of the kind shown in FIG. 6 compared with a fully silicided device of the kind shown in FIG. 2.

FIG. 7 is a graph showing data relating to the transmission line pulse (TLP) current and voltage of an ESD device in accordance with an embodiment of this invention compared with a fully silicided device. FIG. 7 also illustrates the leakage current characteristic of these devices. In particular, the devices compared in FIG. 7 are a device of the kind described above in relation to FIG. 5 and a fully silicided device having a similarly sized active region. For the hilly silicided device, the width of the active region was $120\ \mu m$ and the gate length was $0.5\ \mu m$. For the device according to an embodiment of the invention, the width of the active region was $120\ \mu m$, the gate length was $0.5\ \mu m$ and the lateral dimension of the unsilicided region $W_1$ was $0.8\ \mu m$.

In FIG. 7, the data 44 plots the leakage current of the filly silicided device, while the data 46 plots the leakage current of the embodiment of this invention. As can be seen from a comparison of the lines 44 and 46, the TLP current at which the device according to an embodiment of this invention fails down is substantially higher than the TLP current at failure of the fully silicided device. In particular, while the fully silicided device fails at a TLP current of around 0.9 amps, the device according to an embodiment of the invention fails at a TLP current of a little over 1.4 amps. Because the device according to an embodiment of this invention fails at a current that is significantly higher than the fully silicided device, the device according to an embodiment of this invention can be seen to be more robust. This robustness arises from the provision of laterally offset source and drain contacts that force a current flowing through the device to have a lateral component, whereby the current must pass through non-silicide portions that are located laterally between the offset source and drain contacts. Again, it is noted that this additional robustness has been achieved without a substantial increase in the size of the active region.

The lines 40 and 42 in FIG. 7 plot TLP voltage against TLP current for the known device (the line 40) and the device according to an embodiment of the invention (the line 42). As can be seen, the trigger voltage of both devices is around 8 volts. After snapback, the holding voltage for both devices is around 5.5 volts for both devices. Accordingly, it can be seen that key device parameters such as the trigger voltage and holding voltage are not affected by the inclusion of the offset contacts or nonsilicide regions. Accordingly, according to an embodiment of this invention, the ESD robustness of an ESD protection device can be improved without adversely affecting other device parameters.

Figure 8:
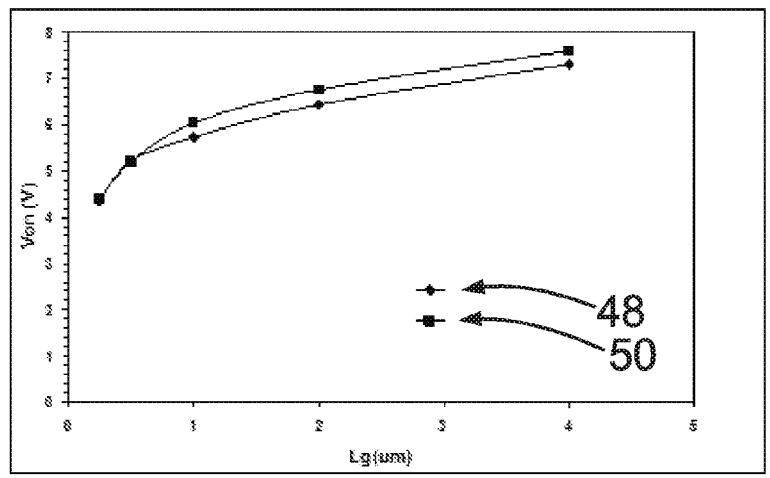
FIG. 8 shows a graph of the holding voltage as a function of gate length of a semiconductor device of the kind shown in FIG. 6 compared with a fully shielded device of the kind shown in FIG. 2.

In FIG. 8, the holding voltage of the fully silicided device and a device according to an embodiment of this invention (again of the kind shown in FIG. 5) is plotted as a function of gate length in microns. In particular, the data points 48 relate to the fully silicided device whereas the data points 50 relate to embodiments of this invention. As can be seen, the holding voltage was measured for a number of different devices each having a different gate length ranging between $0.25\ \mu m$ and $4\ \mu m$.

It is clear from FIG. 8 that as the length of the gate is varied, the effect this has on the holding voltage is substantially similar fur both the fully silicided device and devices according to an embodiment of this invention. It can therefore be concluded that the layout of an ESD protection device in accordance with an embodiment of this invention does not adversely affect the holding voltage over a range of different gate lengths. Therefore, the ESD robustness of a device according to an embodiment of the invention is shown to be enhanced without adversely affecting the holding voltage—and this holds true over a range of different gate lengths.

Figure 9:
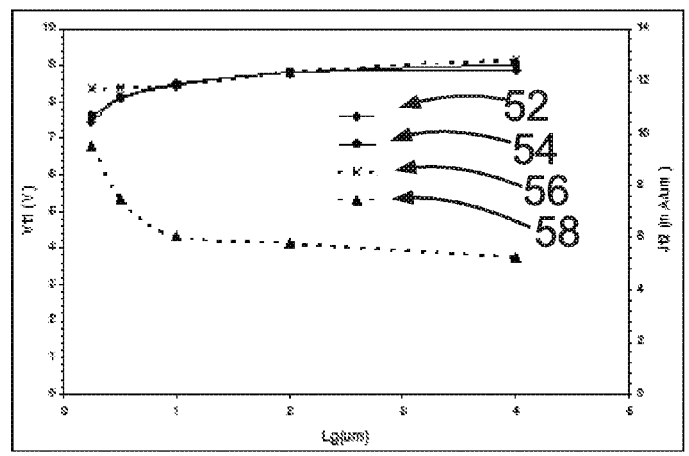
FIG. 9 shows a graph of the trigger voltage and failure current density as a function of gate length of a semiconductor device of the kind shown in FIG. 6 compared with a fully silicided device of the kind shown in FIG. 2.

In FIG. 9, the trigger voltage (Vt1) and the ESD robustness (Jt2) are both plotted against gate length in microns for fully silicided devices (of the kind shown in FIG. 2) and for devices in accordance with an embodiment of this invention (again of the kind shown in FIG. 5). In particular, data points 52 and 54 relate to the trigger voltage of the fully silicided device and a device in accordance with an embodiment of this invention, respectively. The data points 56 and 58 relate to the ESD robustness of the fully silicided device and the device in accordance with an embodiment of this invention.

As can be seen in FIG. 9, the trigger voltage Vt1 as a function of gate length for the fully silicided devices and for the devices in accordance with an embodiment of this invention are substantially similar. Accordingly, it can be concluded that the layout of a device in accordance with an embodiment of this invention does not adversely affect the trigger voltage of the device.

On the other hand, FIG. 9 clearly shows that the ESD robustness of the fully silicided device decreases dramatically with increasing gate length between 0.25 µm and 1 µm and continues to decrease as the gate length is increased to 4 µm. In contrast, the ESD robustness of the device in accordance with an embodiment of this invention is largely unaffected by gate length and, if anything, actually increases as the length of the gate increases.

The data shown in FIGS. 7-9 collectively illustrate that by the layout of an ESD protection device in accordance with an embodiment of this invention can improve ESD robustness while not adversely affecting the normal operation of the device. This fact holds true over a range of different gate lengths.

Figure 10:
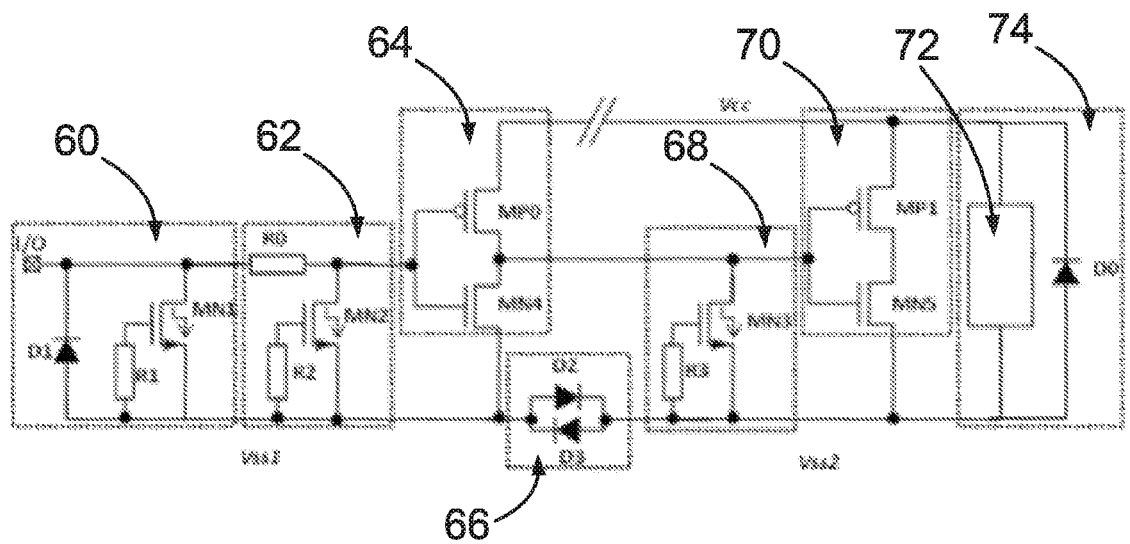
FIG. 10 shows various design configurations in which a semiconductor device for providing protection against ESD may be implemented in accordance with an embodiment of the invention.

FIG. 10 illustrates the various design configurations where a device in accordance with an embodiment of this invention may be implemented in a BiCMOS design. In particular, in the example of FIG. 10, the source, gate and body region of a device on a semiconductor substrate are electrically connected together to ground to form a ggNMOS transistor configured to act as a npn parasitic bipolar transistor.

A device according to an embodiment of the invention may provide primary Pad-based ESD Protection shown in FIG. 10 at reference numeral 60. Here, D1 is the return path ESD diode in the IO cell, MN1 is an unsilicided ggNMOS transistor of the kind disclosed herein sized to sustain high ESD current and R1 is a gate to source discrete resistor of the primary ESD protection ggNMOS transistor.

A device according to an embodiment of the invention may also provide secondary ESD protection shown in FIG. 10 at reference numeral 62. Here, R0 is a series resistor that limits the ESD current in the secondary ESD protection. MN2 is a ggNMOS transistor acting as a secondary ESD protection, and R2 is a gate to source discrete resistor of the secondary ESD protection ggNMOS transistor.

In FIG. 10, reference numeral 64 denotes a circuit to be protected. Here, MP0 and MP1 are PMOS transistors of the inverters and MN4 and MN5 are NMOS transistors of the inverters.

A device according to an embodiment of the invention may further be used as a local ESD clamp (denoted at reference numeral 68). Here, MN3 is a ggNMOS transistor acting as a local CDM (Charge Device Model) clamp and R3 is a gate to source discrete resistor of the local CDM clamp ggNMOS transistor.

A device according to an embodiment of the invention may also be used as an ESD main supply clamp, denoted in FIG. 10 at reference numerals 74. Here, reference numeral 70 indicates a circuit to be protected. Supply clamp 72 is an active bipolar ESD clamp and D0 is the return path ESD diode in the supply cell.

An ESD protection device according to an embodiment of this invention may be applied to fail safe inputs/outputs of BiCMOS IC designs such as:
 a signal conditioner IC for a full spectrum transceiver,
 a transceiver for remote keyless entry,
 a variable gain amplifier, a medium power amplifier, a low noise amplifier, or a low noise block of a satellite down converter.

Accordingly, there has been described an electrostatic discharge (ESD) protection device on a semiconductor substrate and a method for making the same. The device has an active region. The active region includes a gate. The active region also includes a source including a silicide portion having a source contact. The active region further includes a drain including a silicide portion having a drain contact. The source and drain each extend away from the gate along a device axis. The drain contact is laterally offset with respect to the source contact along a direction orthogonal to the device axis whereby current flow between the source contact and the drain contact has a lateral component. The device further comprises a non-silicide region located laterally between the drain contact and the source contact.

Although particular embodiments of the invention have been described, it will be appreciated that many modifications/additions and/or substitutions may be made within the scope of the claimed invention.

The invention claimed is:

1. An electrostatic discharge (ESD) protection device on a semiconductor substrate, the device having an active region comprising:
 a gate;
 a source including a silicide portion having a source contact; and
 a drain including a silicide portion having a drain contact,
 wherein the source and drain each extend away from the gate along a device axis,
 wherein the drain contact is laterally offset with respect to the source contact along a direction orthogonal to the device axis whereby current flow between the source contact and the drain contact has a lateral component, and
 wherein the device further comprises a non-silicide region located laterally between the drain contact and the source contact.

2. The device of claim 1 comprising a plurality of drain contacts and a plurality of source contacts.

3. The device of claim 2, wherein each drain contact is laterally offset with respect to its neighboring source contact(s).

4. The device of claim 2, wherein the non-silicide region comprises a plurality of non-silicide sections each located laterally between a respective pair of drain and source contacts.

5. The device of claim 4, wherein a lateral dimension $W_1$ of the non-silicide sections is at least 0.2 µm and at most equal to a full width of the device minus the lateral widths of source contact(s) and drain contact(s).

6. The device of claim 4, wherein a lateral dimension $W_1$ of the non-silicide sections is in the range $0.6\ \mu m \leq W_1 \leq 8\ \mu m$.

7. The device of claim 5, wherein each of said non-silicide sections has the same lateral dimension $W_1$.

8. The device of claim 4, wherein at least some of the plurality of non-silicide sections of the non-silicide region are linked together by further non-silicide sections, wherein said further non-silicide sections extend laterally across the drain or the source.

9. The device of claim 8, wherein at least some of said further non-silicide sections occupy substantially all of the drain or source on an opposite side of the gate from a respective source contact or drain contact.

10. The device of claim 8, wherein a lateral dimension $W_2$ of said further non-silicide sections is in the range $0.5\ \mu m \le W_2 \le 2\ \mu m$.

11. The device of claim 1, wherein the non-silicide region extends over a full length of the active region along the device axis.

12. The device of claim 1 comprising a protection layer for preventing silicidation of the non-silicide region during manufacture.

13. The device of claim 1, wherein the gate, the source and a body region of the substrate are electrically connected together for application of a common reference potential.

14. An electrostatic discharge (ESD) protection circuit comprising the device of claim 1.

15. The device of claim 1, comprising a silicide portion that extends over the source region, gate region, and drain region along the device axis.

16. The device of claim 1, wherein the non-silicide region has the same width as the source region and of the drain region.

17. The device of claim 1, wherein the non-silicide region has a width wider than the width of the source region and of the drain region.

18. The device of claim 1, wherein the non-silicide region extends a combined length of the source region, gate region, and drain region along the device axis.

\* \* \* \* \*